(12) United States Patent
Girdhar et al.

(10) Patent No.: US 7,829,970 B2
(45) Date of Patent: Nov. 9, 2010

(54) JUNCTION BARRIER SCHOTTKY DIODE HAVING HIGH REVERSE BLOCKING VOLTAGE

(75) Inventors: Dev Alok Girdhar, Melbourne, FL (US); Michael David Church, Sebastian, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/107,177

(22) Filed: Apr. 22, 2008

(65) Prior Publication Data

US 2008/0296722 A1 Dec. 4, 2008

Related U.S. Application Data

(60) Provisional application No. 60/940,750, filed on May 30, 2007, provisional application No. 60/940,730, filed on May 30, 2007.

(51) Int. Cl.
*H01L 27/095* (2006.01)
*H01L 29/47* (2006.01)
*H01L 31/07* (2006.01)

(52) U.S. Cl. .............. 257/476; 257/471; 257/472; 257/473; 257/474; 257/475; 257/477; 257/478; 257/479; 257/480; 257/481; 257/482; 257/483; 257/484; 257/485; 257/486; 257/E29.338

(58) Field of Classification Search .......... 257/476, 257/471–486, E29.338; 438/570–583
See application file for complete search history.

(56) References Cited

U.S. PATENT DOCUMENTS 4,641,174 A * 2/1987 Baliga ..................... 257/264
4,829,361 A * 5/1989 Sagara et al. ............ 257/297
5,017,976 A * 5/1991 Sugita ..................... 257/494
6,861,723 B2 3/2005 Willmeroth
2004/0046224 A1* 3/2004 Rossel et al. ............. 257/471
2005/0139947 A1* 6/2005 Okada et al. ............. 257/480
2006/0237813 A1* 10/2006 Hshieh et al. ............ 257/475
2006/0244050 A1 11/2006 Sudou

FOREIGN PATENT DOCUMENTS

| JP | 53-053270 | | 5/1978 |
| JP | 2002373943 A | * | 12/2002 |
| JP | 2003-188391 | | 7/2003 |

OTHER PUBLICATIONS

R. Perez, N. Mestres, M. Vellvehi, P. Godignon, J. Millan; Analysis of 1.2 kV JBS rectifiers fabricated in 4H-SiC; Semiconductor Sci. Technol. 21 No. 5 (May 2006); p. 670-676 (examiner labeled pp. 1-14).*
R. Perez et al., Analysis of 1.2 kV JBS rectifiers fabricated in 4H-SiC; Semiconductor Sci. Technol. 21 No. 5 (May 2006); p. 670-676. (examiner labeled 1-14 pages).*

* cited by examiner

*Primary Examiner*—Fernando L Toledo
*Assistant Examiner*—John P Dulka

(57) ABSTRACT

A junction barrier Schottky diode has an N-type well having surface and a first impurity concentration; a p-type anode region in the surface of the well, and having a second impurity concentration; and an N-type cathode region in the surface of the well and horizontally abutting the anode region, and having a third impurity concentration. A first N-type region vertically abuts the anode and cathode regions, and has a fourth impurity concentration. An ohmic contact is made to the anode and a Schottky contact is made to the cathode. The fourth impurity concentration is less than the first, second and third impurity concentrations.

11 Claims, 5 Drawing Sheets

US 7,829,970 B2

JUNCTION BARRIER SCHOTTKY DIODE HAVING HIGH REVERSE BLOCKING VOLTAGE

BACKGROUND AND SUMMARY OF THE DISCLOSURE

The present disclosure relates generally to a junction barrier Schottky diode (JBS) and, more specifically, to a junction barrier Schottky diode with higher reverse blocking voltage.

Integrated circuits have generally included Schottky diodes for power applications. Schottky diodes tend to be very leaky at high reverse bias and high temperatures. Circuit designers have used junction barrier Schottky diodes to provide a solution to the leaky Schottky diodes. This combination provides a Schottky-like forward conduction and PN diode like reverse blocking of voltage. It basically includes a PN junction and a Schottky junction diode in parallel. Although this has solved the leakage problems, the JBS diodes built to date have historically had reverse blocking voltages in the range of 30 volts. There is a need to provide an improved JBS diode with substantially greater reverse blocking voltage.

The present junction barrier Schottky diode has an N-type well having a surface and a first impurity concentration; a p-type anode region in the surface of the well, and having a second impurity concentration; and an N-type cathode region in the surface of the well and horizontally abutting the anode region, and having a third impurity concentration. A first N-type region vertically abuts the anode and cathode regions, and has a fourth impurity concentration. An ohmic contact is made to the anode and a Schottky contact is made to the cathode. The fourth impurity concentration is less than the first, second and third impurity concentrations.

The cathode and anode regions have substantially the same depth. The cathode and anode regions may be concentric. The cathode region may be between two spaced anode regions or the anode region may be between two spaced cathode regions.

The maximum impurity concentration of the anode region is below the surface. The fourth impurity concentration's maximum may be one order of magnitude less than the second impurity concentration's maximum, and the fourth impurity concentration's minimum is one order of magnitude less than the third impurity concentration's maximum. The second, third and fourth impurity concentrations are of a value to produce a diode having a reverse blocking voltage of at least 60 volts.

The N-type well may include a buried p-type region below and vertically abutting the first N-type region and having a fifth impurity concentration. The second, third, fourth and fifth impurity concentrations may be of a value to produce a diode having a reverse blocking voltage of at least 70 volts or at least 90 volts.

Although the junction barrier Schottky diode is generally used in integrated circuits, the present junction barrier Schottky diode may be a discrete device.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
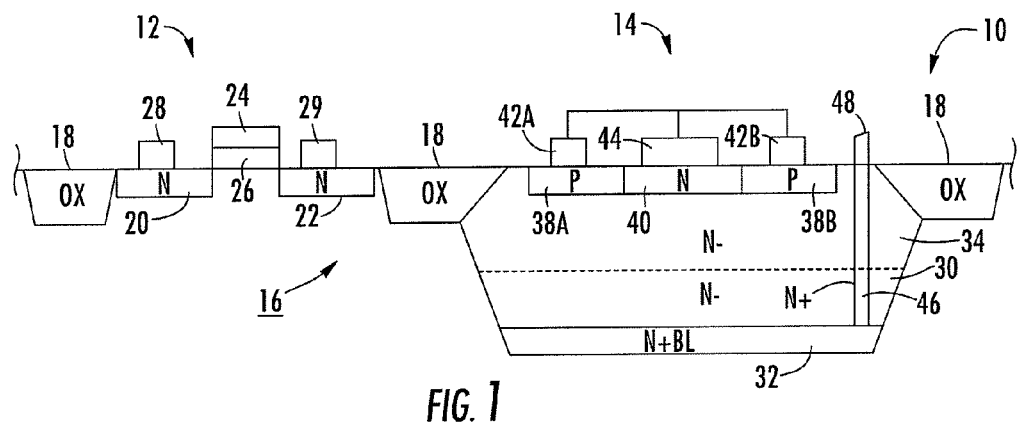
FIG. 1 is cross-sectional view of an integrated circuit including a junction barrier Schottky diode incorporating the principles of the present disclosure.

FIG. 1 illustrates an integrated circuit 10 including a field effect transistor FET 12 and a junction barrier Schottky diode 14. A p-type substrate 16 includes lateral oxide isolation regions 18 offering lateral isolation at the surface between various devices including the FET 12 and the JBS 14. The FET 12 is illustrated as including an N-type source 20 and drain 22 in the P-type substrate 16. A gate 24 is separated from the channel region between the source 20 and the drain 22 by a gate oxide 26. Source contact 28 and drain contact 29 are also shown.

The junction barrier Schottky diode 14 includes an N-type well 30 having a buried N+ BL layer 32. The upper portion or surface region of the JBS 14 includes an N− region 34. A pair of P-type anode regions 38A and 38B are formed in the surface of region 34. A cathode region 40 laterally abuts the pair of anode regions 38. The N− region 34 has a lower impurity concentration than the P anode regions 38 and N cathode region 40. It also has a lower impurity concentration than the N well 30. It should be noted that the cathode region 40 has generally the same depth as the anode 38 such that in the lateral direction there is a higher impurity concentration between the anodes 38 A and B while the lower or vertical abutment of the anodes 38A and B is with the lower impurity N− region 34. The plus and minus is to illustrate their relative impurity concentration. A more detailed explanation of the impurity concentrations are illustrated to be discussed below.

Anode contacts 42A and 42B are made to the anode region 38A and 38B and a Schottky barrier contact 44 is made with cathode region 40. An N+ cathode contact region 46 extends from the surface to the N+ buried layer 32. A contact 48 is made to the cathode contact region 46. Materials that form these contacts to produce the appropriate functions are well-known. The cathode region 40 is an active cell partition. The N− region 34 is a lower doping region and the N+-burier layer 32, which carries the current laterally to the cathode. The anode PN contacts 42A and 42B and Schottky contact 44 are shown as connected to a common point. This may be by the interconnect structure or by extending the Schottky contact 44 laterally onto the P-region 38.

Figure 6:
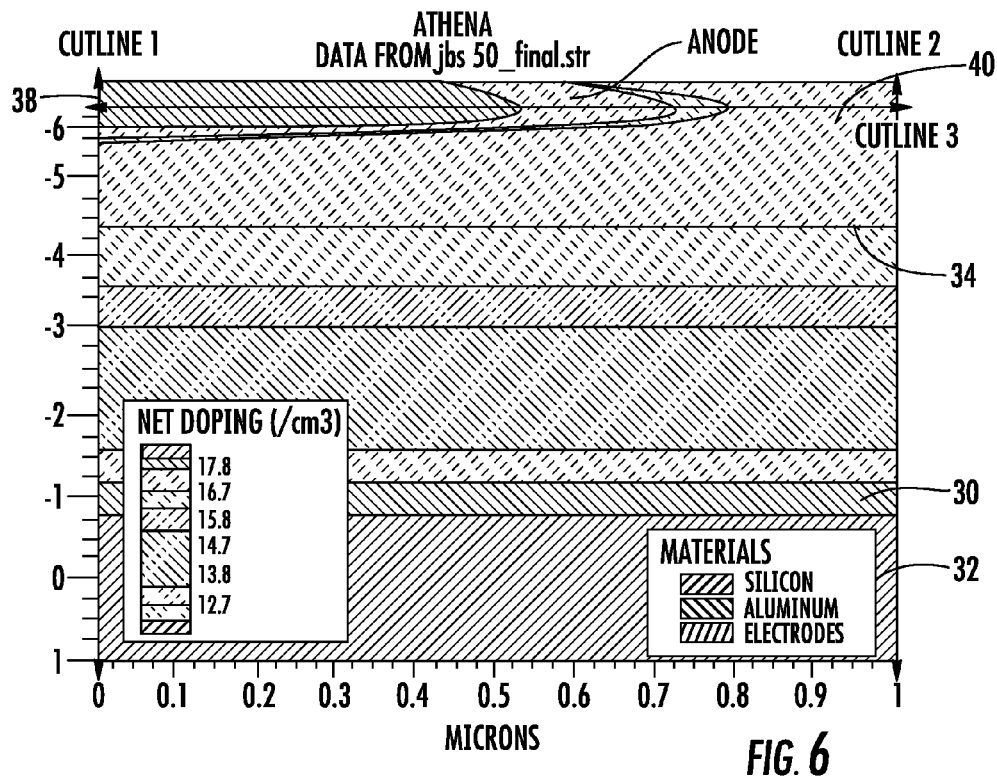
FIG. 6 is cross-sectional view of a first junction barrier Schottky diode incorporating the principles of the present disclosure.

An example of a cross-section of the implementation of the junction barrier Schottky diode 14 is illustrated in FIG. 6. The P-region 38 is ion implanted and is selected to have a peak impurity concentration below the surface of the well 30. In, the implementation shown, it is generally along the cutline 3 at about 0.5 microns from the surface. The N-region 40 is also formed by ion implantation. The example shown is for a JBS50 which indicates that for the one micron dimension, that the anode and cathode regions of the two parallel diodes are implanted to represent half of the one-micron dimension.

Figure 2:
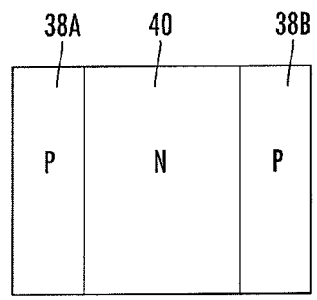
FIG. 2 is plain view of a first arrangement of the anode and cathode regions of a junction barrier Schottky diode incorporating the principles of the present disclosure.
Figure 3:
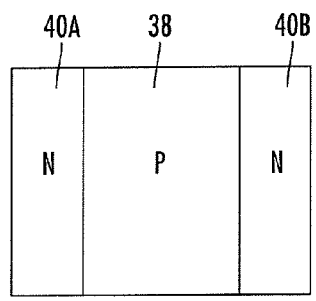
FIG. 3 is plain view of a second arrangement of the anode and cathode regions of a junction barrier Schottky diode incorporating the principles of the present disclosure.

The lateral abutment of the anode region 38 and the cathode region 40 may take various configurations. As previously mentioned, they are generally of the same depth from the surface of the well 30. In one embodiment illustrated in FIG. 2, the cathode region 40 separates to anode region 38A and 38B. As an alternative illustrated in FIG. 3, a single anode region 38 may separate a pair of cathode regions 40A and 40B. The space between the two anode regions 38A and 38B or the two cathode regions 40A and 40B is less than 1 micron and is selected for a specific forward voltage drop and leakage current.

Figure 4:
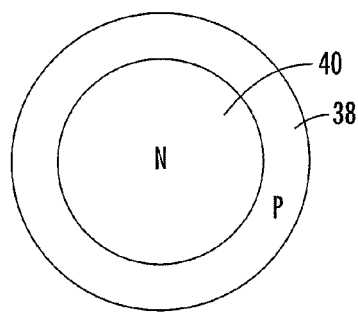
FIG. 4 is plain view of a third arrangement of the anode and cathode regions of a junction barrier Schottky diode incorporating the principles of the present disclosure.
Figure 5:
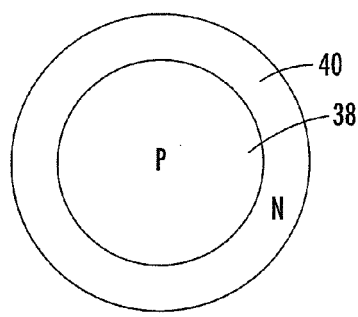
FIG. 5 is plain view of a fourth arrangement of the anode and cathode regions of a junction barrier Schottky diode incorporating the principles of the present disclosure.

A concentric embodiment is illustrated in FIGS. 4 and 5. In FIG. 4 the cathode region 40 is surrounded by the anode region 38. In FIG. 5 the anode region 38 is surrounded by cathode region 40.

Figure 7:
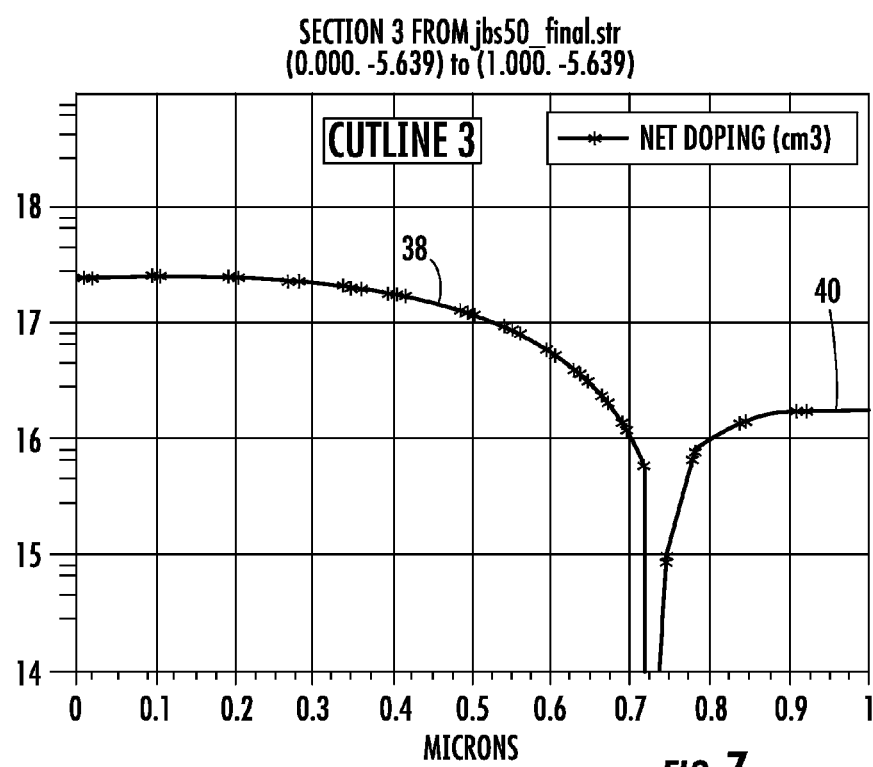
FIG. 7 is a graph of impurity concentration along cutline 3 of FIG. 6.

Even though the original implantation of the anode 38 and the cathode 40 are each for half a micron due to other heat steps in the process, the P-type impurities of the anode migrate laterally into the cathode region. FIG. 7 illustrates cutline 3 which is the lateral profile of the impurity concentration. As will be noted, there is a small region of approximately 0.05 microns where the n and p impurity concentrations cancel each other out.

Figure 8:
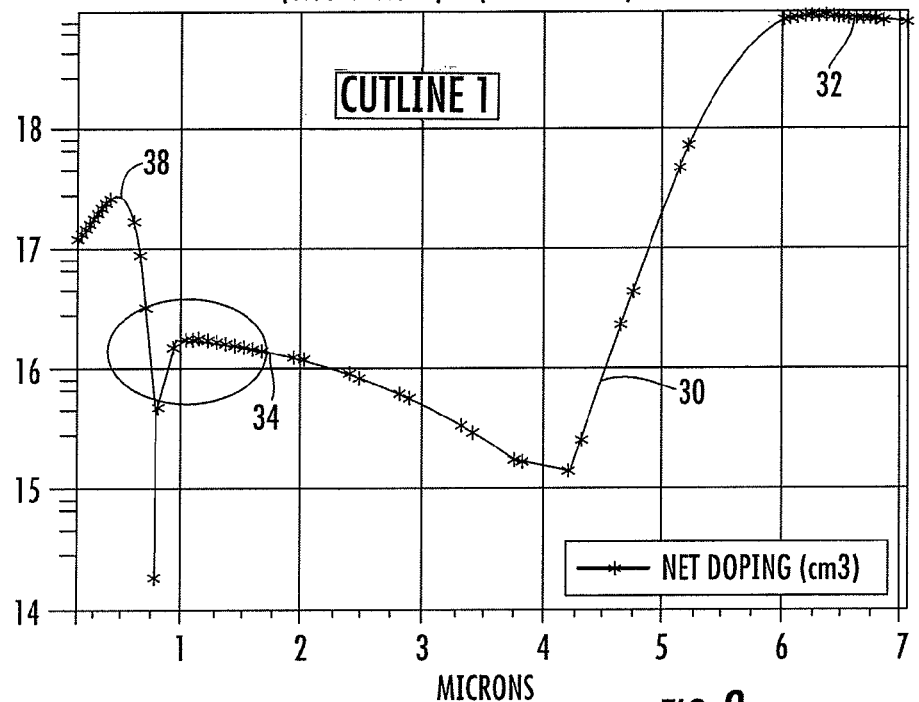
FIG. 8 is a graph of impurity concentration along cutline 1 of FIG. 6.
Figure 9:
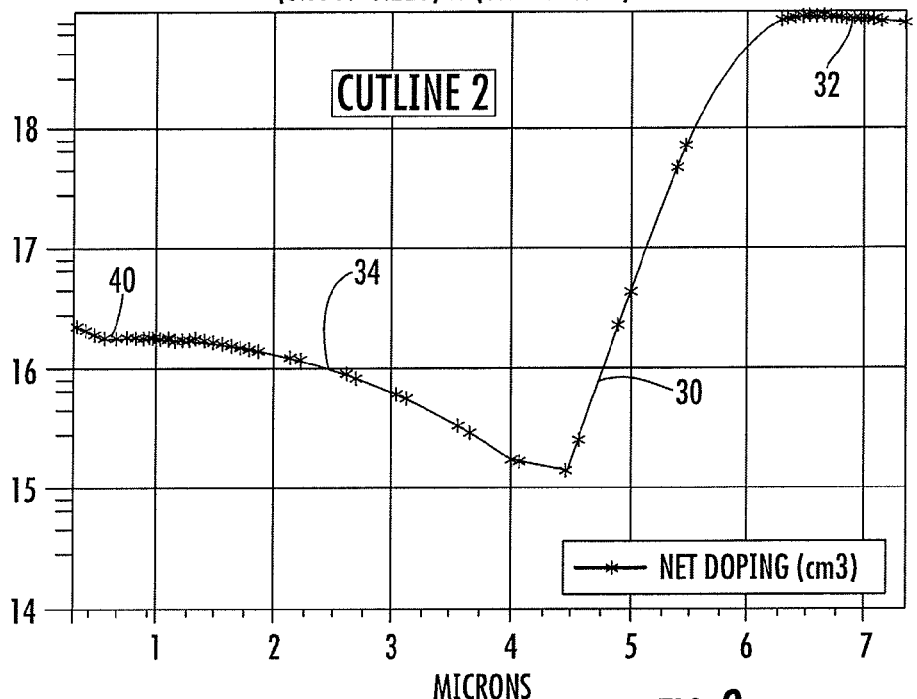
FIG. 9 is a graph of impurity concentration along cutline 2 of FIG. 6.

FIG. 8 illustrates at cutline 1, which is from the surface through the anode region 38 into regions 34, 30 and 32. It should be noted at about approximately a half micron is the peak impurity concentration for the anode region 38. This peak is greater than $1 \times 10^{17}$ carriers per cubic centimeter. You will note that the surface cathode region 40 has an impurity concentration of just greater than $1 \times 10^{16}$ carriers per cubic centimeter. That is true for FIGS. 7 and 9. Cutline 2 illustrates the specific doping profile for the cathode region 40, region 34, 30 and 32. The structure shown produces a reverse blocking voltage of least 60 volts.

Figure 10:
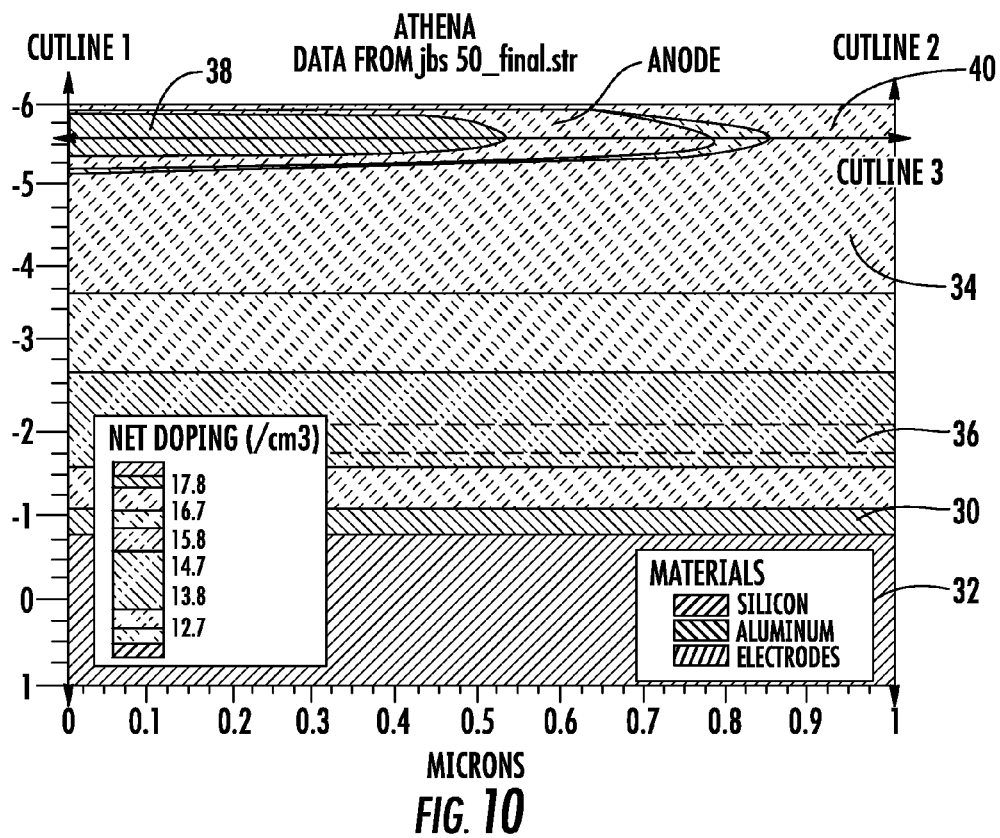
FIG. 10 is cross-sectional view of a second junction barrier Schottky diode incorporating the principles of the present disclosure.
Figure 11:
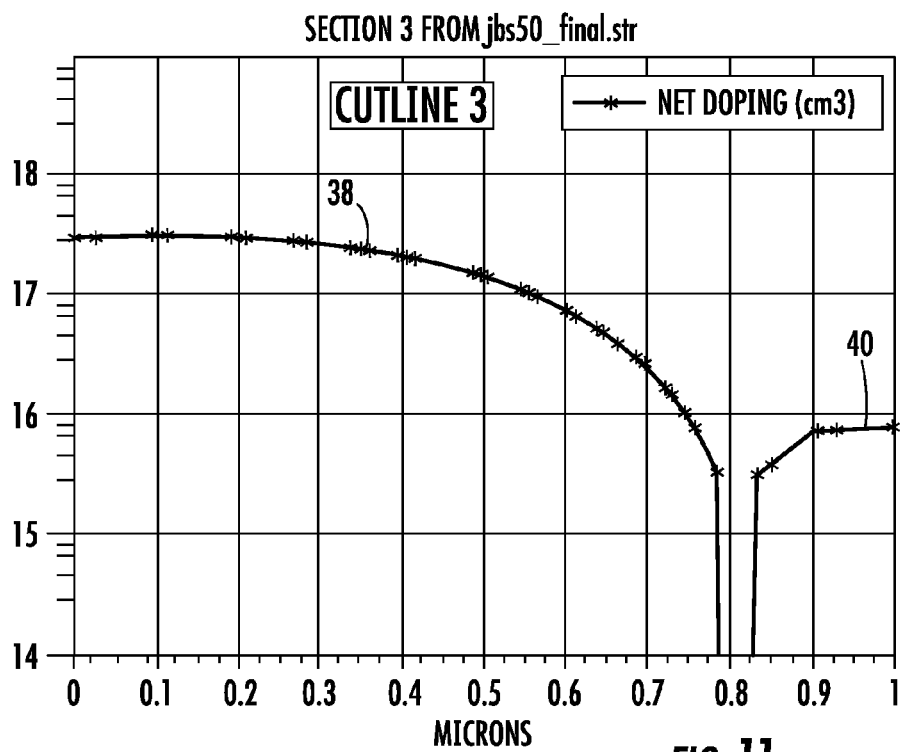
FIG. 11 is a graph of impurity concentration along cutline 3 of FIG. 10.
Figure 12:
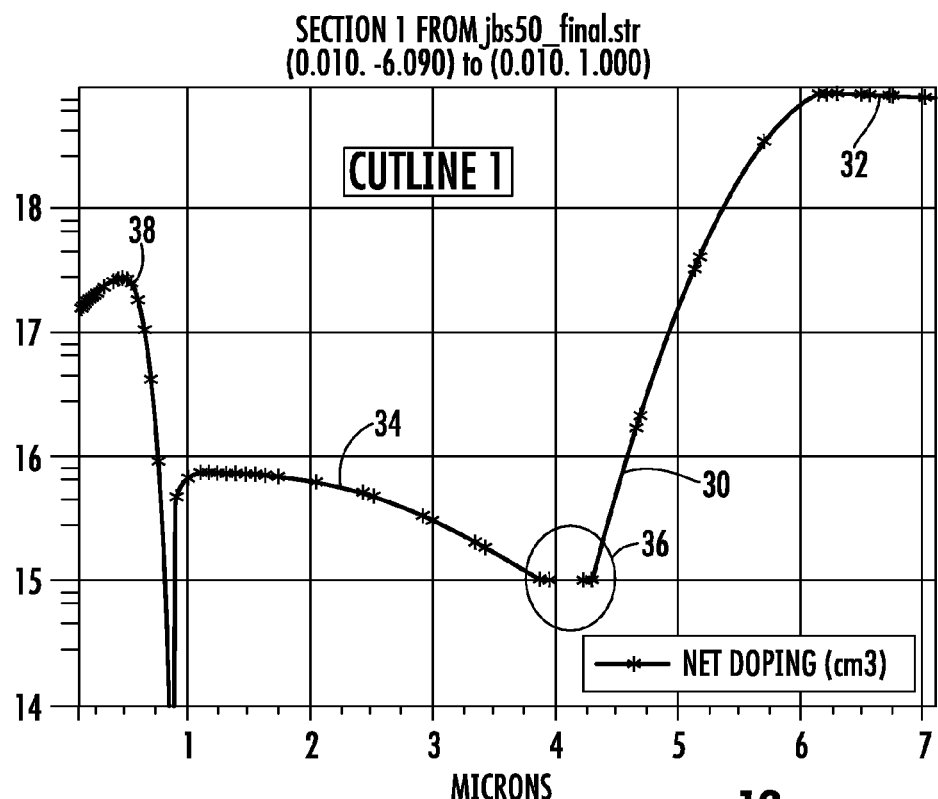
FIG. 12 is a graph of impurity concentration along cutline 1 of FIG. 10.
Figure 13:
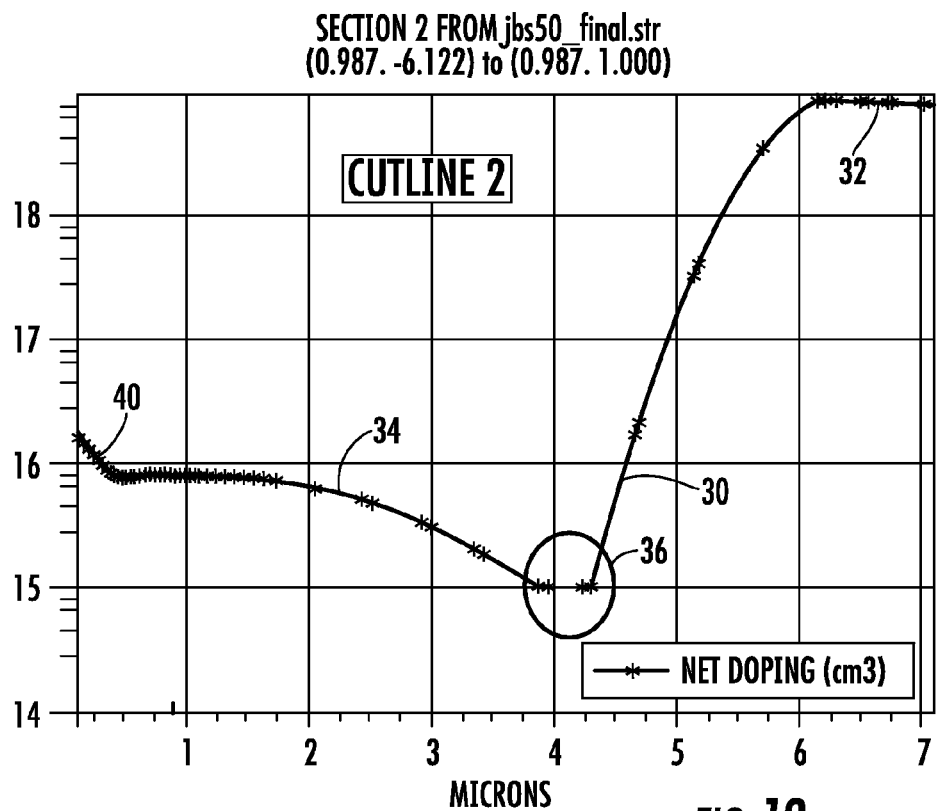
FIG. 13 is a graph of impurity concentration along cutline 2 of FIG. 10.

A modification to the junction barrier Schottky diode of FIGS. 1 and 6 is illustrated in FIG. 10. In addition to the lightly doped region 34 which reduces the doping level of the well 30, a P-type region 36 is provided between the region 34 and the well portion 30. As illustrated in FIGS. 12 and 13, this provides a disruption or discontinuity in the N impurity concentration of the well at between 4 and 4.3 microns from the surface. In comparing FIGS. 8 and 12, the impurity concentration for the P-region 38 and the N+ region 40 is not affected by the addition of the buried P region 36. What is changed is the N impurity concentrations as illustrated by the difference between FIGS. 8-9 and 12-13. With the addition of the P region, the N region 34 is below $1 \times 10^{16}$ in FIG. 12 where it is above $1 \times 10^{16}$ in FIG. 8 for the N region 34. Also in comparing FIGS. 9 and 13, the drop-off of the N-type impurity regions diminishes quicker in the cathode region 40 for that of FIG. 9 versus that of FIG. 13. Also the region 40 in cutline 3, which is approximately 0.9 microns, is above $1 \times 10^{16}$ in FIG. 7 but below than in FIG. 11. By addition of the P-type region 36, the reverse blocking voltage has been increased to 90 volts.

A comparison of a Schottky diode and a PN diode to four different structures of the junction barrier Schottky diode of that illustrated in FIG. 10 is shown in Table 1.

TABLE 1

|  | Vf @ 100 A/cm2 (V) | Vr @ 1 mA/cm2 (V) | log (Ihole) @ vf | Ihole @ 100 A/cm2 (%) |
| --- | --- | --- | --- | --- |
| Schottky2 | 0.46 | 32 | 0 | 0 |
| JBS30 | 0.5 | 70 | −10.45 | 0.004 |
| JBS40 | 0.52 | 82 | −10.2 | 0.006 |
| JBS50 | 0.575 | 91 | −9.13 | 0.07 |
| JBS60 | 0.68 | 95.5 | −7.15 | 7.08 |
| PN2 | .0733 | 102 | −6 | 100 |

The diodes JBS30, 40, 50 and 60 have different structures. As discussed previously, the number represents the size of the implementation of the anode region 38 with the portion of a one micron length. Thus, the remainder of the area being the Schottky cathode region 40. One can see that the reverse blocking voltage increases 70 volts for JBS30 up to 95.5 volts for JBS60. Thus as the Schottky cathode region 40 diminishes relative to the size of the anode region 38, the reverse breakdown voltage increases.

Although the present disclosure has been described and illustrated in detail, it is to be clearly understood that this is done by way of illustration and example only and is not to be taken by way of limitation. The present junction barrier Schottky diode may also be a discrete device. The scope of the present disclosure is to be limited only by the terms of the appended claims.

What is claimed is:

1. A junction barrier Schottky diode in an integrated circuit, the diode comprising:
   an N-type well having a surface and a maximum first impurity concentration at the surface in a P-type substrate;
   a P-type anode region in the surface of the well and having a bottom surface, and having a second impurity concentration;
   an N-type cathode region in the surface of the well adjacent the anode region and having a bottom surface, and having a third impurity concentration;
   a first N-type region vertically abutting the bottom surfaces of the anode and cathode regions, and having a fourth impurity concentration at the bottom surface of the anode region;
   a buried N-type region in the N-type well and having a fifth impurity concentration;
   an ohmic contact to the anode region, a Schottky contact to the cathode region and an ohmic contact to the buried region from the surface; and
   the fourth impurity concentration at the bottom surface of the anode region being less than the maximum first, second, third and fifth impurity concentrations.

2. The diode of claim 1, wherein cathode and anode regions have substantially the same depth.

3. The diode of claim 1, wherein cathode and anode regions are concentric.

4. The diode of claim 1, including two spaced anode regions and the cathode region is between the two spaced anode regions.

5. The diode of claim 4, wherein the space between the two anode regions is less than 1 micron and is selected for a specific forward voltage drop and leakage current.

6. The diode of claim 1, including two spaced cathode regions and the anode region is between the two spaced cathode regions.

7. The diode of claim 6, wherein the space between the two cathodes regions is less than 1 micron and is selected for a specific forward voltage drop and leakage current.

8. The diode of claim 1, wherein a maximum impurity concentration of the anode region is below the surface.

9. The diode of claim 1, wherein the fourth impurity concentration is at least one order of magnitude less than the second impurity concentration's maximum, and the fourth impurity concentration is at least one order of magnitude less than the third impurity concentration's maximum.

10. The diode of claim 1, wherein the second, third and fourth impurity concentrations are of a value to produce a diode having a reverse blocking voltage of at least 60 volts.

11. The diode of claim 1, wherein the first N-type region vertically separates the anode and cathode regions from the N-type well.

* * * * *